United States Patent [19]

Meyer

[11] Patent Number: 4,500,854

[45] Date of Patent: Feb. 19, 1985

[54] VOLTAGE-CONTROLLED RF OSCILLATOR EMPLOYING WIDEBAND TUNABLE LC RESONATOR

[75] Inventor: Donald G. Meyer, Sultan, Wash.

[73] Assignee: John Fluke Mfg. Co., Inc., Everett, Wash.

[21] Appl. No.: 255,675

[22] Filed: Apr. 20, 1981

[51] Int. Cl.³ .................... H03H 7/12; H03B 5/18; H01P 7/08
[52] U.S. Cl. .................... 331/117 R; 331/96; 331/107 SL; 331/177 V; 334/15; 333/205
[58] Field of Search .............. 331/96, 99, 107 SL, 331/117 R, 177 V, 36 C; 332/30 V; 334/15, 64, 78; 333/204, 205, 221

[56] References Cited

U.S. PATENT DOCUMENTS

| | | | |
|---|---|---|---|
| 3,230,422 | 1/1966 | Gourber et al. | 331/170 X |
| 3,624,554 | 11/1971 | Hilliker | 331/117 D |
| 4,121,182 | 10/1978 | Makimoto et al. | 334/15 X |
| 4,129,842 | 12/1978 | Torii et al. | 331/96 X |

OTHER PUBLICATIONS

"Antenna Engineering Handbook", by Henry Jasik, Editor, McGraw-Hill Book Company, Dec. 1975.
"Engineer's Notebook", Varactor Pair in New Stripline Circuit Improves Modulation; by Donald Neul, *Electronics*, Jul. 31, 1972.

Primary Examiner—Eugene R. Laroche
Assistant Examiner—W. R. Paxman
Attorney, Agent, or Firm—James W. Anable; Mikio Ishimaru; Stephen A. Becker

[57] ABSTRACT

Stray capacitance is reduced in a wideband tunable oscillator network by arranging the resonant circuit as one or more series circuit branches wherein a variable capacitance such as a varactor diode is interposed between two substantially identical inductors. In the disclosed VHF-UHF oscillator, the inductors are realized by TEM transmission lines of the stripline variety. The stripline is formed by a multilayer printed circuit board arrangement and two resonant circuit branches are interconnected in a manner that permits biasing of the varactor diodes without the use of blocking capacitors in the resonant circuit path.

17 Claims, 6 Drawing Figures

VOLTAGE-CONTROLLED RF OSCILLATOR EMPLOYING WIDEBAND TUNABLE LC RESONATOR

BACKGROUND OF THE INVENTION

This invention relates to resonant circuit structure and more particularly to resonant circuits such as relatively high frequency oscillators and other circuit arrangements wherein stray reactance and spurious resonance are important design constraints that can seriously limit circuit operation and performance.

As is well-known to those skilled in the art, the performance of resonant electrical structure is often affected by stray reactance terms such as, for example, capacitance and inductance that is attributable to the circuit interconnections or wiring and undesired reactance terms that are associated with the circuit components utilized, e.g., the parasitic or stray capacitance of an inductive element being used within the resonant circuit. Although such stray reactance sometimes can be incorporated into the circuit design or can be minimized by careful circuit layout and by judiciously selecting a type of capacitor, inductor or resistor that is most appropriate to the frequencies of interest, many situations arise wherein stray reactance remains appreciably large relative to the design values of the reactances utilized in the resonant circuit. Under such circumstances the resonant frequency of the circuit can be substantially below the theoretical design value (i.e., that which would result if ideal inductors and capacitors were employed).

The drawbacks and disadvantages that result from stray reactance terms are especially significant in the design and realization of circuitry employing tunable resonators that are intended to operate over a relatively wide frequency range. For example, the hereinafter disclosed embodiment of the invention is an electronically tubable oscillator which operates in the VHF-UHF region of the frequency spectrum and is continuously tunable over at least a full octave. Utilizing conventional circuit analysis techniques and assuming the use of variable capacitors such as state of the art varactor diodes and fixed value inductors, it can be shown that the tuning ratio of an LC resonator (i.e., the ratio of the maximum and minimum resonant frequencies) is $[(C_s+KC_0)/(C_s+C_0)]^{\frac{1}{2}}$, where the varactor diode is tunable between a capacitance value of $C_0$ and $KC_0$ (i.e., K is a positive real scale factor), $C_s$ represents stray capacitance associated with the resonant circuit inductor and it is assumed that the oscillator active elements and associated bias components do not affect operation of the resonator. Examining this expression for the tuning ratio it can be recognized that although $K=4$ will provide an octave-wide tuning range when $C_s=0$, K must be equal to 5.5 in order to provide that same bandwidth when $C_s=C_0/2$, (i.e., when the stray capacitance associated with the circuit is one-half the minimum capacitance of the varactor diode tuning element). Few state of the art electronically controllable devices such as varactor diodes provide the capacitance variations necessary to permit tuning over a frequency range of one octave or more when stray capacitance is considered, especially at frequencies within the UHF portion of the spectrum where relatively low values of inductance and capacitance are utilized in the resonant circuit.

Accordingly, it is an object of this invention to provide resonant circuit structure that is arranged to minimize the effect of stray reactance terms.

It is a further and more specific object of this invention to provide a tunable LC resonant circuit wherein the effect of stray capacitance is minimized to thereby optimize the usable tuning range of such resonant circuit.

It is still another object of this invention to provide an electronically-tuned oscillator that can be used over at least one octave of the VHF-UHF region of the frequency spectrum wherein the circuit is arranged to minimize stray capacitance that would otherwise reduce the usable tuning range of the oscillator.

SUMMARY OF THE INVENTION

These and other objects are achieved in accordance with this invention by the use of one or more resonant circuit branches which include two inductors of equal inductance value and a varactor diode or other variable capacitor, with the capacitance element being serially interposed between the inductors. As shall be discussed in more detail, each circuit branch of this type can be modeled as (i.e., is effectively equivalent to) a circuit arrangement wherein the variable capacitance (e.g., capacitance of the varactor diode) is replaced with two serially-connected capacitors, each having a capacitance value twice that presented by the varactor diode or other capacitance element, with the common connection between the two capacitors being, in effect, an AC ground point (virtual ground) at the resonant frequency of the system. When stray capacitance that is exhibited between circuit common and each of the two circuit nodes defined by the junctions between the varactor diode and the associated pair of inductors is considered in the resonant circuit model, it can be shown that the effect of such stray capacitance is theoretically reduced by a factor of 4 (relative to a more conventional arrangement which includes an identical capacitance element in series with a single inductor having a value equal to the total inductance of the pair of inductors used in a resonant circuit branch that is constructed in accordance with the invention).

The disclosed embodiment, which is tunable over a portion of the VHF-UHF region (e.g., an octave-wide frequency range extending between 250 and 500 megahertz), employs two resonant circuit branches wherein each inductor terminal of one circuit branch that is not connected to the variable capacitor is connected to a corresponding inductor terminal of the second circuit branch. In this arrangement, an RF choke couples the varactor DC frequency control signal (bias signal) to one of the junctions between the inductors of the two resonant circuit branches. This arrangement facilitates varactor tuning (and hence frequency selection) without using a blocking capacitor in the resonant circuit path. This is advantageous since a blocking capacitor typically exhibits relatively high series resistance and thus low circuit Q (quality factor) at frequencies within the UHF range. The second junction between the two interconnected resonant circuit branches is connected either directly to circuit common potential (e.g., ground) or is coupled to circuit common via a capacitor if a low frequency (e.g., audio) signal is to be injected at the second junction in order to provide a second frequency control terminal which can be utilized, for example, to phase or frequency modulate the oscillator circuit.

To facilitate optimal performance over a frequency range that falls within the upper VHF and UHF bands, the inductors of each resonant circuit branch are defined by TEM transmission lines that are substantially less than one-quarter wavelength long at the highest frequency of interest, with the ends of the center conductors of the transmission line being interconnected with one another and either being directly connected to circuit common or connected to a point in the circuit arrangement that is substantially at circuit common potential when resonance is attained (i.e., a "virtual ground" point). In the disclosed embodiment of the invention, a TEM transmission line arrangement commonly referred to as stripline is employed wherein a multilayer printed circuit board is configured to define a ribbon-like center conductor that extends between two substantially parallel, spaced-apart conductive ground planes with the circuit board material serving as the transmission line dielectric material. This configuration attains relatively optimal inductor Q's at frequencies within the UHF band and is also the preferred arrangement because the metalization pattern employed permits mounting of the varactor diodes so as to substantially minimize and control the inductance associated with the diode leads and thereby allow incorporation of such inductance into the design of the oscillator.

In the disclosed embodiment, the active circuit device for establishing and maintaining oscillatory current flow through the two resonant circuit branches is a transistor stage which basically corresponds to a modified cascode circuit having the base and collector electrodes of the first transistor connected to the first and second resonant circuit branches at the junction between the varactor diode and one of the inductors. The base electrode of the second transistor is connected to circuit common potential so as to form a common base circuit. A series RC circuit is utilized to couple signal between the emitter electrodes of the two transistors and, in some cases, can be configured to resonate with the stray inductance of the coupling path to thereby reduce excess phase shift in the feedback path of the oscillator. Additionally, a second RC series network is connected between circuit common and the junction between resonant circuit branches that is not coupled to circuit common (or a virtual ground point) to suppress spurious oscillation.

BRIEF DESCRIPTION OF THE DRAWINGS

Other objects and advantages of the present invention will be apparent to one of ordinary skill in the art upon consideration of the following description taken together with the accompanying drawings wherein.

DETAILED DESCRIPTION

Figure 1:
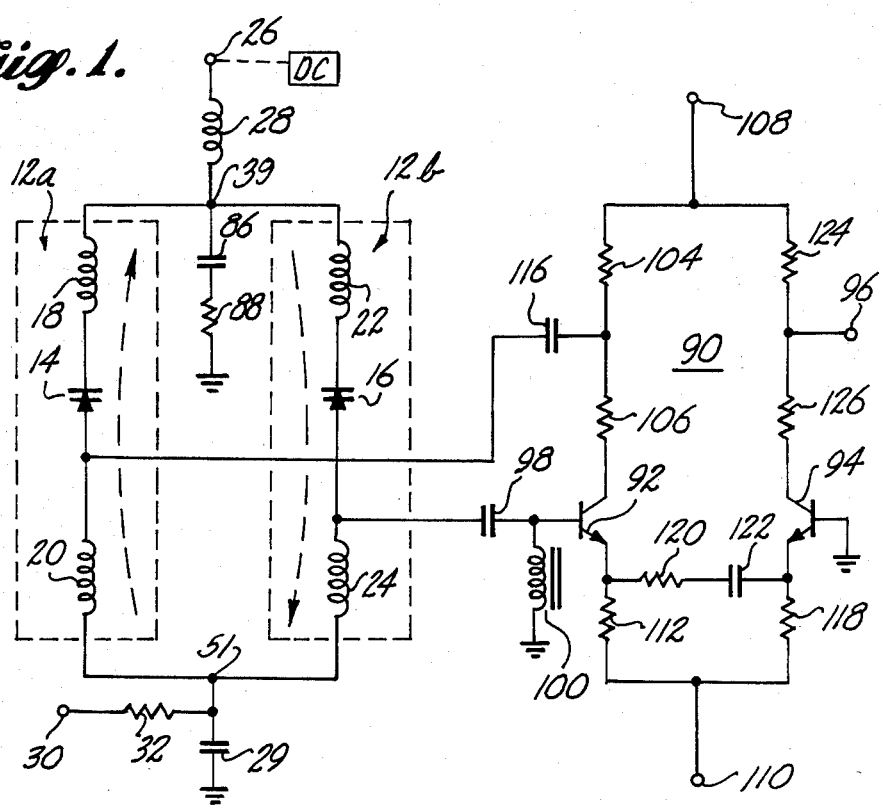
FIG. 1 is a schematic diagram of a wideband, electronically tunable oscillator that is constructed in accordance with this invention to include a LC resonant circuit arranged to minimize the effect of stray capacitance terms that are associated with the resonant circuit elements.

FIG. 1 depicts an electronically-tuned RF oscillator constructed in accordance with this invention to include a resonator circuit which is arranged to minimize stray reactance that would otherwise limit or reduce the circuit tuning range or bandwidth. More specifically, the oscillator of FIG. 1 includes two resonant circuit branches 12a and 12b that are interconnected with one another and are individually configured to minimize stray capacitance terms that would otherwise reduce the resonant frequency from its ideal or theoretical value. As is shown in FIG. 1, resonant circuit branches 12a and 12b are identical in structure, with resonant circuit branch 12a including a varactor diode 14 and resonant circuit branch 12b including a substantially identical varactor diode 16. As is further illustrated, varactor diode 14 is serially connected with and interposed between a pair of inductors (18 and 20), with varactor diode 16 being connected in the same manner between a second pair of inductors (22 and 24). In the arrangement of FIG. 1, inductors 18, 20, 22 and 24 are of substantially identical structure so as to exhibit substantially identical circuit characteristics, including inductance value and stray capacitance. In this regard, as shall be recognized upon understanding the complete structure and operation of the arrangement of FIG. 1, circuit symmetry is an important aspect of the present invention and the circuit operation which reduces stray reactance and more fully realizes the theoretically available tuning range of an LC resonant circuit arrangement. Thus, it is important that, insofar as is possible, substantially identical (i.e., "matched") components be utilized within the resonant circuit branches 12a and 12b to maintain circuit symmetry.

As is well-known to those skilled in the art, varactor diodes are variable reactance devices which provide a capacitance that varies in accordance with the diode reverse bias voltage. In this regard, although various commercially available varactor diodes can be utilized in practicing this invention, hyper-abrupt varactor diodes are currently utilized in presently employed realizations of the embodiment of FIG. 1 that operate between 250 and 500 megahertz because such varactor diodes exhibit a capacitance that varies as the reciprocal of the square of the bias voltage to thereby provide a substantially linear resonant frequency-bias voltage relationship. In the embodiment of FIG. 1, the bias or tuning voltage for controlling the capacitance of varactor diodes 14 and 16 and hence the operating frequency of the depicted oscillator circuit is applied to a terminal 26 and coupled to resonant circuit branches 12a and 12b via an RF choke (inductor) 28, which is connected between terminal 26 and the circuit node 39 defined by the junction between inductors 18 and 22. Since the second junction 51 between circuit branches 12a and 12b of the depicted arrangement (i.e., the circuit node defined by the connection between inductors 20 and 24) is connected to circuit common potential by means of a capacitor 29, the DC tuning potential applied between terminals 26 and 30 is developed across each of the varactor diodes 14 and 16.

Capacitor 29 provides a circuit node which permits frequency modulation of the oscillator arrangement depicted in FIG. 1 at frequencies that are substantially below the resonant frequency of circuit branches 12a and 12b (i.e., the frequency of oscillation of the depicted circuit). Thus, the capacitance value of capacitor 29 is typically several orders of magnitude greater than the maximum capacitance of varactor diodes 14 and 16 so that the junction between inductors 20 and 24 is effectively at circuit common potential relative to signals at or near the frequency of oscillation. In this regard, in embodiments of the invention which do not require a second tuning port for frequency modulation or other purposes, capacitor 29 can be eliminated and the junction between inductors 20 and 24 connected directly to circuit common. In embodiments of the invention which do provide for the injection of an additional tuning or modulation signal at the interconnection between inductors 20 and 24, a variety of circuit arrangements can be employed to provide any necessary signal conditioning. For example, in the arrangement of FIG. 1, the frequency modulation signal is applied to a terminal 30 and is coupled to the junction between capacitor 29 and inductors 20 and 24 via a resistor 32. Resistor 32 and capacitor 29 provide first order low-pass filtering of the applied modulation signal.

Although resonant circuit arrangements constructed in accordance with this invention can be utilized over various frequency bands, the invention is especially advantageous at frequencies in and above the VHF region, where stray capacitance is relatively large as compared to the capacitance values required for resonance. In this portion of the frequency spectrum, maximum circuit Q and minimum stray capacitance is attained by utilizing relatively short sections of TEM (Transverse Electric Mode) transmission lines to define inductors 18, 20, 22 and 24. More specifically, as is known in the art, short-circuited ideal (i.e., lossless)-transmission lines exhibit an impedance of $jZ_0 \tan \beta l$, where j denotes the imaginary operator (i.e., $(-1)^{\frac{1}{2}}$), $Z_0$ is the characteristic impedance of the transmission line, l denotes the length of the short-circuited TEM line, and $\beta$ denotes the system propagation constant (which is identically equal to $2\pi/\lambda$, where $\lambda$ represents the wavelength of the electrical signal propagating along or induced into the TEM line). Since $\tan \beta l$ is a substantially linear function of frequency for relatively small values of l, (e.g., $\lambda/8$ and less), relatively short sections of TEM transmission line are satisfactorily employed as inductors in the present invention.

Figure 2:
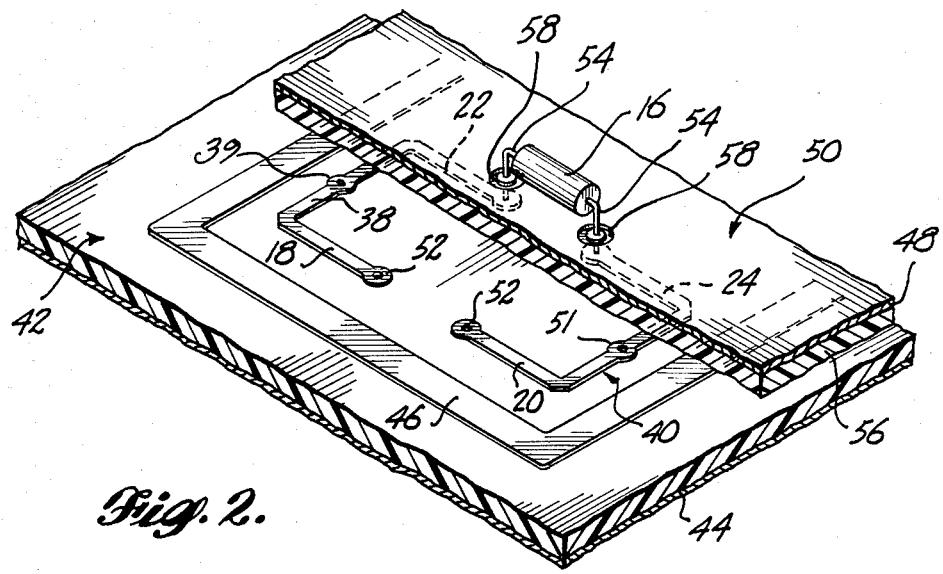
FIG. 2 is a partially cutaway isometric view of a physical realization of the resonant circuit depicted in FIG. 1 wherein the circuit inductors are defined by striplines that are formed through printed circuit techniques.

By way of example, and with reference to FIG. 2, the previously-mentioned, presently-preferred embodiment of the invention operates over a frequency range extending from approximately 250 megahertz to approximately 520 megahertz and utilizes a type of TEM transmission line that is commonly referred to as stripline to define inductors 18, 20, 22 and 24. More specifically, the resonant circuit arrangement depicted in FIG. 2 includes two substantially U-shaped center conductors 38 and 40 that are formed by conventional printed circuit techniques on the upper surface of a printed circuit board 42. The lower surface of printed circuit board 42 includes a thin copper layer 44, which forms one of the outer conductors (or ground planes) for the stripline structure. Preferably, the U-shaped center conductors 38 and 40 are completely or substantially surrounded by a conductive strip 46, which is formed on the upper surface of printed circuit board 42 when the center conductors are formed and aids in isolating the center conductors 38 and 40 from electromagnetic fields that may be present in the environment in which the invention is being utilized. The second ground plane for the stripline is defined by a thin copper layer 48 on the upper surface of a second printed circuit board 50, with printed circuit board 50 being bonded to the upper surface of printed circuit board 42 with a conventional adhesive material.

In this arrangement, the U-shaped center conductor 38 and the associated ground planes 44 and 48 define two inductors of the resonant circuit depicted in FIG. 1 (e.g., inductors 18 and 22) and the stripline structure including U-shaped center conductor 40 defines the two remaining inductors of the resonant circuit (e.g., inductors 20 and 24), with each inductor including an upwardly extending arm of the associated U-shaped conductive region and one-half of the bottom or transverse arm thereof. The circuit land or pad 39, which is formed at the center of the transverse leg of U-shaped conductor 38, corresponds to the circuit node between inductors 18 and 22 in FIG. 1 and can be connected, through RF choke 28, to a D.C. source at 26. Similarly, the circuit land or pad 51, which is formed at the center of the transverse leg of U-shaped conductor 40, corresponds to the circuit node between inductors 20 and 24 in FIG. 1 and can be connected to appropriate circuit components within the depicted circuit arrangement (i.e., capacitor 29 and resistor 32) by means of conventional wiring or printed circuit techniques.

The stripline arrangement of FIG. 2 is not only advantageous because it provides maximum Q inductors having relatively low stray capacitance terms, but is also desirable in that interconnection with varactor diodes 14 and 16 is facilitated. In particular, in the depicted arrangement, U-shaped center conductors 38 and 40 are positioned to form a substantially rectangular pattern wherein the ends of each upright arm within U-shaped center conductor 38 is spaced apart from the end of an arm within U-shaped center conductor 40 by a distance commensurate with the axial dimension of varactor diodes 14 and 16. With this arrangement, varactor diodes 14 and 16 are mounted on the upper surface of printed circuit board 50 so as to be positioned over the two gaps or spaces between the U-shaped center conductors 38 and 40 and the varactor diode leads 54, which extend axially from each end of the varactor diodes 14 and 16 are electrically connected to circuit pads 52 in the terminal region of the U-shaped center conductors 38 and 40. As will be recognized by those skilled in the art, various techniques can be employed to form the electrical connection between circuit pads 52 and leads 54 of varactor diodes 14 and 16, including plated-through holes that extend completely through the dielectric material 56 of printed circuit board 50 and connect with circuit pads 52, or circuit board grommets that are installed to printed circuit board 50 (not shown in FIG. 2). In any case, small regions 58 of the copper layer 48 that is located on the upper surface of printed circuit board 50 are removed to permit electrical connection between the varactor diodes 14 and 16 and inductors 18, 20, 22 and 24 (i.e., circuit pads 52 in FIG. 2).

It should be noted that portions of varactor diode leads 54 that extend between the varactor diode and the electrical connection with the associated inductor 18, 20, 22 or 24 can exhibit an inductance value that is significant relative to the total inductance required for resonance at frequencies within the desired tuning range. For example, when the arrangement of FIG. 2 is utilized to cover various portions of the UHF band, the inductance required for each resonant circuit branch 12a and 12b of FIG. 1 can be on the order of 25 to 30 nanohenries. Although this would indicate that each inductor 18, 20, 22 and 24 should exhibit an inductance value of approximately 12.5 to 15 nanohenries (one-half the inductance required for resonance), the inductance of leads 54 of each varactor diode 14 and 16 can be on the order of 5 nanohenries. Thus, it is generally advantageous to determine the amount of inductance associated with the varactor diode leads and incorporate this inductance into the circuit design by reducing the inductance of inductors 18, 20, 22 and 24 by an appropriate amount. Further, since optimal operation of the invention requires symmetry of the resonant circuit branches, varactor diodes 14 and 16 are preferably positioned such that the inductance exhibited by each axially extending lead 54 is substantially equal to that presented by each other lead 54.

It should also be noted that although the sections of TEM transmission line that define inductors 18, 20, 22 and 24 are referred to herein as short-circuited lines, a direct connection between circuit common potential and center conductors 38 and 40 is not required. In this regard and as previously mentioned, the junction between inductors 20 and 24 of the arrangement of FIG. 1 is effectively at circuit common potential for all frequencies within the resonant bandwidth of circuit branches 12a and 12b since capacitor 29 exhibits a very low impedance at these frequencies. Moreover, as was previously mentioned, this circuit node can be directly connected to circuit common in embodiments of the depicted oscillator that do not require a second tuning port such as that provided at terminal 30. As can be ascertained from FIG. 1, the circuit node between inductors 18 and 22 cannot be directly connected to circuit common since such a configuration would not provide the necessary bias or tuning voltage for varactor diodes 14 and 16 and would not provide the necessary feedback. Nonetheless, and as shall be described hereinafter, circuit symmetry and the currents flowing within resonant circuit branches 12a and 12b establish a virtual ground at this circuit node to thereby, in effect, short-circuit the sections of TEM transmission line being employed as inductors 18 and 22.

Figure 3A:
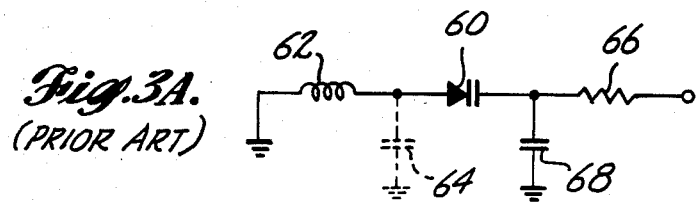
FIG. 3 is a schematic diagram useful in understanding the present invention with FIG. 3A illustrating a typical prior art arrangement and FIGS. 3B through 3D depicting the schematic diagram of a single resonant circuit branch of the type utilized in this invention and equivalent circuit models that are useful in understanding the invention.
Figure 3B:
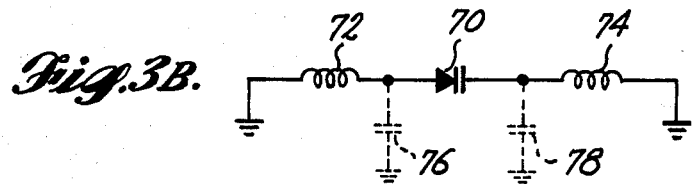
Figure 3C:
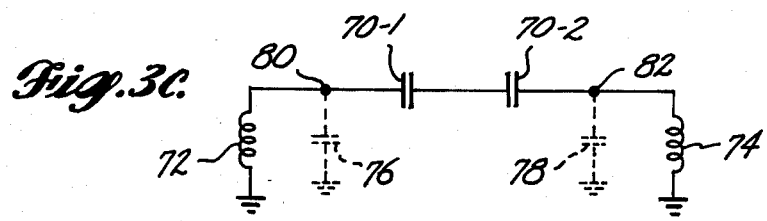
Figure 3D:
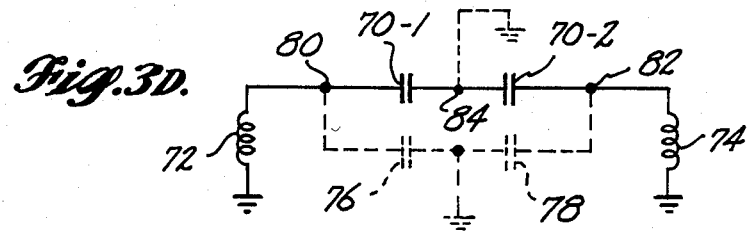

The manner in which the embodiment of FIG. 1 operates to reduce the effect of the stray capacitance associated with inductors 18, 20, 22 and 24 can be understood with reference to FIGS. 3A through 3D, which depict a typical prior art LC tunable resonant circuit branch (FIG. 3A), a tunable resonant circuit corresponding to resonant circuit branches 12a and 12b of FIG. 1 (FIG. 3B), and circuit models equivalent thereto (FIGS. 3C and 3D). In particular, FIG. 3A depicts a circuit arrangement wherein a varactor diode 60 is connected in series with a single inductor 62, which exhibits a stray capacitance (with respect to circuit common potential) represented by a capacitor 64. In this prior art arrangement, the tuning signal or bias is supplied to varactor diode 60 via a resistor 66 and a large capacitor 68, which eliminates transient and noise signals that might otherwise affect circuit operation. Assuming that resistor 66 and capacitor 68 are suitably selected and do not exhibit parasitic reactances that affect circuit resonance, it can be seen that the resonant frequency of the network depicted in FIG. 3A is $1/[2\pi(L_{62}(C_{64}+C_{60}))^{\frac{1}{2}}]$, where $L_{62}$ represents the inductance of inductor 62, $C_{60}$ denotes the capacitance of varactor diode 60, and $C_{64}$ denotes the capacitance of capacitor 64 (i.e., the stray capacitance associated with the inductor 62). Since $C_{64}$ is equal to zero in the ideal or theoretical situation, it can be shown that the stray capacitance reduces the resonant frequency of the depicted circuit to $[C_{60}/(C_{64}+C_{60})]^{\frac{1}{2}}f_0$, where $f_0$ denotes the theoretical or ideal resonant frequency (i.e., the resonant frequency when $C_{64}$ is equal to zero). In terms of the circuit tuning range it can be shown that, if varactor diode 60 is tunable from a value of $C_0$ to $KC_0$ (where K is a positive real number), the stray capacitance $C_{64}$ causes a reduction in tuning range so that the ratio of actual tuning ratio to ideal tuning ratio is $[(C_{64}+KC_{60})/(C_{64}+C_{60})]^{\frac{1}{2}}$. Thus, for example, if K is equal to 4 and the stray capacitance is equal to one-half the value of the minimum capacitance of varactor diode 60 (i.e., $C_{64}=C_0/2$), the tuning range of the depicted circuit is reduced from a factor of 2 (i.e., an octave) to the square root of 3 (approximately 1.732) and is thus only approximately 87% of its theoretical or ideal value.

As was previously described relative to the circuit branches 12a and 12b of the oscillator arrangement of FIG. 1, a resonant circuit branch configured in accordance with this invention includes a variable capacitive element (varactor diode 70 in FIG. 3B) that is serially connected with and interposed between two inductors of substantially equal inductance value (inductors 72 and 74 in FIG. 3B). Thus, if the arrangement of FIG. 3B utilizes a varactor diode 70 that is substantially identical to varactor diode 60 of the prior art arrangement depicted in FIG. 3A, the two circuits will exhibit substantially identical theoretical (or ideal) resonant frequencies when $L_{72}=L_{74}=L_{62}/2$, where $L_{62}$, $L_{72}$ and $L_{74}$ denote the inductance values of inductors 62, 72 and 74, respectively.

As is indicated in FIG. 3B, each of the two separate, equal valued inductors 72 and 74 exhibit a stray capacitance relative to circuit common (denoted by capacitors 76 and 78, respectively). Since inductors 72 and 74 are substantially identical, the stray capacitance associated with the two inductors will be substantially identical as long as generally recognized circuit layout techniques e.g., printed circuit design) are utilized. Moreover, since a particular resonant frequency is attained by the arrangement of FIG. 3B when the inductance value of inductors 72 and 74 is one-half that of the inductor 62 of FIG. 3A, the value of stray capacitance associated with inductors 72 and 74 (capacitors 76 and 78 in FIG. 3B) can easily be made less than the stray capacitance associated with inductor 62 of FIG. 3A (i.e., capacitor 64). In particular, with respect to inductors that are formed by relatively short sections of TEM transmission lines in the previously discussed manner, the stray capacitance values of inductors 72 and 74 are substantially equal to one-half the stray capacitance exhibited by inductor 62 of FIG. 3A (i.e., $C_{76}=C_{78}=C_{64}/2$), since TEM transmission lines exhibit a substantially uniform series inductance and shunt capacitance per unit length.

Applying basic circuit theory, it can be recognized that the capacitance presented by varactor diode 70 for any particular reversed bias condition can be represented or modeled as two series-connected capacitors 70-1 and 70-2 in FIG. 3C, with capacitors 70-1 and 70-2 each exhibiting a capacitance value twice that exhibited by varactor diode 70 (i.e., $C_{70-1}=C_{70-2}=2C_{70}$). Because of the above-mentioned equality relationships between component values and symmetry of the network, the voltages appearing at the two electrodes of varactor diode 70 (circuit nodes 80 and 82 in FIGS. 3C and 3D)

will be equal in magnitude and substantially 180° ($\pi$ radians) out-of-phase with one another. Thus, the voltage at the junction between capacitor 70-1 and capacitor 70-2 of FIG. 3C (denoted as circuit node 84) is substantially equal to zero for all signal frequencies that are substantially equal to the resonant frequency of the circuit and, as is indicated in FIG. 3D, can be considered to be connected to circuit common potential (i.e., circuit node 84 is a virtual ground point).

In view of the circuit model of FIG. 3D, it can be recognized that the resonant frequency of the circuit branch depicted in FIG. 3B is $f_0 = 1/[2\pi(L_{72}+L_{74})^{\frac{1}{2}}C_{eq}^{\frac{1}{2}}[$, where $C_{eq}$ is the combined capacitance of varactor diode 70 and the stray capacitance exhibited by inductors 72 and 74 (i.e., the capacitance presented by capacitor $C_{70-1}$, $C_{70-2}$, $C_{76}$ and $C_{78}$), which is given by the expression $$C_{eq} = (C_{70-1} + C_{76})(C_{70-2} + C_{78})/(C_{70-1} + C_{70-2} + C_{76} + C_{78})$$

Assuming that the resonant circuit branch of FIG. 3B is configured and arranged in the previously-discussed manner so that $C_{70-1} = C_{70-2} = 2C = 2C_{60}$ and $C_{76} = C_{78} = C_{64}/2$, then $C_{eq} = C_{60} + C_{64}/4$. Since $L_{72} = L_{74} = L_{62}/2$, when the prior art circuit of FIG. 3A and the circuit of FIG. 3B are configured for resonance at the same theoretical design frequency, it can be shown that the effective stray capacitance associated with the resonant inductors in FIG. 3B has been reduced by a factor of 4, with the resonant frequency of a circuit arranged in accordance with FIG. 3B being given by the expression $f_0 = 1/[2\pi L_{62}^{\frac{1}{2}}(C_{60}+C_{64}/4)^{\frac{1}{2}}]$. Thus, where the varactor diode is tunable over a capacitance range of $C_0$ to $KC_0$, the stray capacitance associated with inductors 72 and 74 of FIG. 3B cause substantially less degradation in circuit tuning ratio than occurs with the prior art circuit of FIG. 3A. In particular, it can be shown that the ratio of the actual tuning ratio to the theoretical tuning ratio of the resonant circuit branch of FIG. 3B is given by the expression $[(KC_0+C_s/4)/(C_0+C_s/4)]^{\frac{1}{2}}$, where $C_s$ designates the total stray capacitance of the inductors 72 and 74 (i.e., $C_{64}$ in FIG. 3A, $C_{76}+C_{78}$ in FIGS. 3B–3D). For example, for the previously-mentioned situation in which the stray capacitance of the resonant circuit inductors is equal to $C_0/2$ and $K = 4$, the resonant circuit branch of FIG. 3B exhibits a tuning ratio that is approximately 96% of the theoretical range of one octave. In comparison, and as was previously mentioned, the prior art arrangement of FIG. 3A exhibits a tuning range that is only approximately 87% of the theoretical one octave range.

As will be recognized by those skilled in the art, active circuit 90 of FIG. 1 is basically a modified cascode stage wherein a first transistor 92 provides the gain required for oscillation and the second transistor 94 operates as a common base buffer stage. More specifically, in the depicted arrangement, a capacitor 98 is connected between the base electrode of transistor 92 and the junction between inductor 24 and varactor diode 16 to thereby couple a signal flowing through circuit branch 12b to active circuit 90 and provide isolation between the DC frequency control signal and the bias levels of the active circuit. An inductor 100, connected between the base electrode of transistor 92 and circuit common, establishes the DC bias level at the base electrode of transistor 92. To complete the bias circuitry and provide operation of transistor 92 in the common emitter mode, serially-connected resistors 104 and 106 are connected between the collector electrode of transistor 92 and a positive supply terminal 108 with the emitter electrode of transistor 92 being connected to a negative supply terminal 110 via resistor 112. Since the collector circuit of transistor 92 is coupled to circuit branch 12a by a capacitor 116 that is connected from the junction between resistors 104 and 106 to the junction between inductor 20 and varactor diode 14, it can be seen that the gain and phase relationships necessary for oscillation are easily met by the depicted circuit. To provide a satisfactory signal output level at terminal 96 without affecting operation of the resonant circuit, the signal flowing in the emitter circuit of transistor 92 is coupled to the emitter electrode of transistor 94, which has the base electrode thereof connected directly to circuit common to thereby operate as a common base stage. In the particular arrangement of FIG. 1, a resistor 118 is connected between the emitter electrode of transistor 94 and the negative supply terminal 110 with an additional signal path being established by series-connected resistor 120 and capacitor 122 which are connected between the emitter electrodes of transistors 92 and 94. The bias and output circuits of transistor 94 are completed by resistors 124 and 126, which are connected in series between the collector electrode of transistor 94 and the junction between resistors 104 and 124, with the junction between resistors 124 and 126 being connected to the circuit output terminal 96.

In the above-described arrangement, bias resistors 104, 124, 112 and 118 are selected to exhibit relatively large resistance values that do not substantially affect the AC operation of the circuit. On the other hand, resistors 106 and 126 are relatively small-valued resistors that are selected for suppression of parasitic oscillations at frequencies exceeding the resonant frequency of the depicted circuit. Series-connected resistor 120 and capacitor 122, which couple the circuit output signal between the emitters of transistors 92 and 94 are selected to reduce excess phase-shaft while maintaining adequate loop gain for sustained oscillation. In this regard, resistor 120 is as large a resistance as will ensure oscillation to thereby minimize the excess phase shift between the base and collector electrodes of transistor 92. Capacitor 122, which isolates the emitter bias circuits of transistors 92 and 94, can sometimes be selected to resonate with the stray inductance of the path between the emitters of transistors 92 and 94, to thereby reduce phase-shift at relatively high operating frequencies. A capacitor 86 and a resistor 88 that are connected between circuit common and the junction between resonant circuit branches 12a and 12b further improves circuit operation in some cases by suppressing high frequency spurious oscillations.

It will be recognized by those skilled in the art that various modifications and variations can be made without departing from the scope and the spirit of this invention. For example, although the embodiment of the invention disclosed herein is an oscillator, resonant circuits configured in the manner described herein can be utilized in other arrangements such as single or multistage tunable filters by appropriately interconnecting one or more resonant circuit branches with active or passive network stages. Moreover, as previously mentioned, various TEM transmission lines other than the striplines discussed herein can be utilized to define the pair of inductors utilized in each resonant circuit branch. For example, at higher frequencies, microstrip TEM transmission line can be employed.

The embodiments of the invention in which an exclusive property or privilege is claimed are defined as follows:

1. An LC resonant circuit wherein the value of capacitance employed is not substantially greater than the value of stray capacitance associated with the inductive structure utilized in said resonant circuit, comprising first and second circuit branches connected in parallel with each other, each of said circuit branches comprising, in series, a voltage variable capacitive element and first and second inductors, said first and second inductors having substantially equal values of inductance and said capacitive element being connected between said inductors to establish voltages of equal magnitude and opposite phase at opposite ends of said capacitive element when said circuit branch resonates;
   first circuit means for applying a source of DC bias at the nodes interconnecting said first and second circuit branches to control said voltage variable capacitive elements;
   input signal means for applying an input signal to one of said first and second circuit branches; and
   output circuit means for obtaining an output signal from the other one of said first and second circuit branches.

2. The electronic circuit of claim 1 wherein said electronic circuit is an oscillator and said LC resonant circuit comprises first and second circuit branches said first and second circuit branches being connected with one another, said oscillator including at least one active circuit element connected between said first and second circuit branches to provide current flow around the circuit loop formed by said first and second circuit branches at the resonant frequency of said LC resonant circuit.

3. In an electronic circuit including an LC resonant circuit wherein the value of capacitance employed is not substantially greater than the value of stray capacitance associated with the inductive structure utilized in said resonant circuit, the improvement comprising structuring said LC resonant circuit to include at least one circuit branch, each said at least one circuit branch having a capacitive element and first and second inductors, said first and second inductors exhibiting substantially equal values of inductance, said capacitive element being connected in series between said first and second inductors to establish voltages of equal magnitude and opposite phase at the two inter-connections formed between said capacitive element and said first and second inductors when each said circuit branch resonates; and
   wherein said electronic circuit is an oscillator and said LC resonant circuit comprises first and second circuit branches each said first and second circuit branches being connected with one another, said oscillator including at least one active circuit element connected between said first and second circuit branches to provide current flow around the circuit loop formed by said first and second circuit branches at the resonant frequency of said LC resonant circuit.

4. The electronic circuit of claim 3 wherein said capacitive element is variable to tune said LC resonant circuit over a relatively wide range of frequencies.

5. The electronic circuit of claim 4 or 1 wherein said first and second inductors are each defined by a section of TEM transmission line that is less than $\lambda/4$, where $\lambda$ is the wavelength associated with the uppermost frequency of said relatively wide range of frequencies, each said TEM transmission line having at least first and second electrical conductors with said second electrical conductor being connected to circuit common potential, the first end of each said first conductor of said TEM transmission line being connected to an electrode of said capacitive element, said electronic circuit being further configured and arranged to cause the potential at the second end of each said first conductor of said TEM transmission line to be substantially equal to said circuit common potential when said LC circuit is at resonance.

6. The electronic circuit of claim 5 wherein said capacitive element is a reverse-biased varactor diode, said electronic circuit further comprising circuit means for coupling a DC tuning signal to said varactor diode to control the capacitance value of said varactor diode and tune said LC resonant circuit to a preselected frequency within said relatively wide range of frequencies.

7. The electronic circuit of claim 6 wherein said TEM transmission line forming said first and second inductors is a stripline structure with said first electrical conductor being a metal strip and said second electrical conductor including first and second metal plates spaced apart from and parallel to one another with said metal strip defining said first electrical conductor being parallel to both said first and second metal plates and being positioned therebetween, said stripline further including a first dielectric region extending between said metal strip defining said first conductor and said first metal plate and a second dielectric region extending between said metal strip defining said first conductor and said second metal plate.

8. In an electronic circuit including an LC resonant circuit wherein the value of capacitance employed is not substantially greater than the value of stray capacitance associated with the inductive structure utilized in said resonant circuit, the improvement comprising structuring said LC resonant circuit to include at least one circuit branch, each said at least one circuit branch having a capacitive element and first and second inductors, said first and second inductors exhibiting substantially equal values of inductance, said capacitive element being connected in series between said first and second inductors to establish voltages of equal magnitude in opposite phase at the two inter-connections formed between said capacitive element and said first and second inductors when each said circuit branch resonates;
   wherein said capacitive element is variable to tune said LC resonant circuit over a relatively wide range of frequencies;
   wherein said first and second inductors are each defined by a section of TEM transmission line that is less than $\lambda/4$, where $\lambda$ is the wavelength associated with the uppermost frequency of said relatively wide range of frequencies, each said TEM transmission line having at least first and second electrical conductors with said second electric conductor being connected to a circuit common potential, the first end of each said first conductor of said TEM transmission line being connected to an electrode of said capacitive element, said electronic circuit being further configured and arranged to cause the potential at the second end of each said first conductor of said TEM transmission lines to be substantially equal to said circuit common potential when said LC circuit is at resonance;

wherein said capacitive element is a reverse-biased varactor diode, said electronic circuit further comprising circuit means for coupling a DC tuning signal to said varactor diode to control the capacitance value of said varactor diode and tune said LC resonant circuit to a preselected frequency within said relatively wide range of frequencies; and wherein said TEM transmission line forming said first and second inductors is a stripline structure with said first electrical conductor being a metal strip and said second electrical conductor including first and second metal plates spaced apart from and parallel to one another with said metal strip defining said first electrical conductor being parallel to both said first and second metal plates and being positioned therebetween, said stripline further including a first dielectric region extending between said metal strip defining said first conductor and said first metal plate and a second dielectric region extending between said metal strip defining said first conductor and said second metal plate.

9. An electronically tunable oscillator circuit comprising:

a resonator including first and second resonant circuit branches, each of said first and second resonant circuit branches including a varactor diode and first and second inductors of substantially equal inductance value, each of said first and second inductors including a first electrode coupled to said varactor diode to connect said varactor diode in series with said first and second inductors thereof, said first and second inductors each including a second electrode, the second electrodes of said first inductors of said first and second resonant circuit branches being connected to one another and said second electrodes of said second inductors of said first and second resonant circuit branches being connected to one another;

first circuit means for applying a tuning voltage to the junction between said first inductors of said first and second circuit branches;

second circuit means for applying a potential to the junction between said second inductors of said first and second circuit branches; and active circuit means connected to at least one of said first and second circuit branches to maintain oscillatory current flow at the resonant frequency of said first and second circuit branches.

10. The electronically tunable oscillator circuit of claim 9 wherein said first and second inductors of said first and second circuit branches are each defined by a section of TEM transmission line having a length less than $\lambda/4$, where $\lambda$ represents the wavelength of a signal at the uppermost resonant frequency associated with the tuning range of said electronically tunable oscillator.

11. The electronically tunable oscillator circuit of claim 10 wherein said active circuit means includes a first transistor having the base electrode thereof coupled to one of said first and second circuit branches and the collector electrode thereof connected to the second one of said first and second circuit branches.

12. The electronically tunable oscillator circuit of claim 11 wherein the base electrode of said first transistor is coupled to the junction between said varactor diode and said second inductor of said first circuit branch and the collector electrode of said first transistor is coupled to the junction between said varactor diode and said second inductor of said second circuit branch.

13. The electronically tunable oscillator circuit of claim 12 wherein said active circuit further includes a second transistor connected for operation in common base mode, the emitter electrode of said second transistor being coupled to the emitter electrode of said first transistor, the base electrode of said second transistor being connected to said terminal of fixed potential, the collector electrode of said second transistor being connected to a terminal for supplying the output signal of said oscillator.

14. The electronically tunable oscillator circuit of claim 9, 10 or 13 wherein said first circuit means is an inductor.

15. The electronically tunable oscillator circuit of claim 14 wherein said second circuit means includes means for connecting said junction between said second inductors of said first and second resonant circuit branches directly to said potential.

16. The electronically tunable oscillator circuit of claim 14 wherein said second circuit means is adapted for frequency modulating said electronically tunable oscillator and includes a first resistor and a first capacitor, said first capacitor being connected between said potential and said junction between said second inductors of said first and second resonant circuit branches, said first resistor being connected between said junction between said second inductors of said first and second resonant circuit branches and a terminal for receiving a modulating signal.

17. The electronically tunable oscillator circuit of claim 16 further comprising a second resistor and a second capacitor, said second resistor and said second capacitor being connected in series with one another between said junction of said first inductors of said first and second resonant circuit branches and said potential.

* * * * *